United States Patent [19]
Groover et al.

[11] Patent Number: 5,530,281
[45] Date of Patent: Jun. 25, 1996

[54] WIREBOND LEAD SYSTEM WITH IMPROVED WIRE SEPARATION

[75] Inventors: Richard L. Groover, Santa Clara; Matthew W. Preston, San Jose, both of Calif.

[73] Assignee: VLSI Technology, Inc., San Jose, Calif.

[21] Appl. No.: 360,880

[22] Filed: Dec. 21, 1994

[51] Int. Cl.⁶ .............................. H01L 23/48; H01L 23/50
[52] U.S. Cl. .......................... 257/666; 257/692; 257/674
[58] Field of Search ................... 257/666, 666.2, 257/669, 670, 674, 692, 698, 676

[56] References Cited

U.S. PATENT DOCUMENTS

| | | | |
|---|---|---|---|
| 4,987,473 | 1/1991 | Johnson | 257/676 |
| 5,291,059 | 3/1994 | Ishitsuka et al. | 257/674 |

FOREIGN PATENT DOCUMENTS

| | | | |
|---|---|---|---|
| 0005648 | 1/1987 | Japan | 257/666 |
| 02097608 | 8/1990 | Japan | 257/666 |
| 0276749 | 12/1991 | Japan | 257/666 |
| 4-17360 | 1/1992 | Japan | 257/666 |
| 0152646 | 5/1992 | Japan | 257/666 |
| 4-144161 | 5/1992 | Japan | 257/666 |
| 0199740 | 7/1992 | Japan | 257/666 |
| 4-255261 | 9/1992 | Japan | 257/692 |

*Primary Examiner*—Robert P. Limanek
*Assistant Examiner*—Alexander Oscar Williams
*Attorney, Agent, or Firm*—Karen S. Perkins

[57] ABSTRACT

Lead systems of the subject invention include "coplanar leads" and "aplanar leads", which differ in structure at the inner bond finger. Coplanar leads are generally planar along the lead body and the inner bond finger. Aplanar leads are bent or deformed at the inner bond finger, such that the inner bond finger terminus is not in the plane of the lead body but instead is above or below the plane of the lead body. Deforming select inner bond fingers out of the general plane of the lead system provides a spatial separation for the bonding wires which are attached to the inner bond fingers. This spatial separation acts to minimize wire crossing and shorting during fill processes and results in improved semiconductor package yield.

8 Claims, 6 Drawing Sheets

WIREBOND LEAD SYSTEM WITH IMPROVED WIRE SEPARATION

TECHNICAL FIELD

This invention relates to the spatial positioning of inner bond fingers and bond wires in a semiconductor die assembly.

BACKGROUND OF THE INVENTION

All lead systems share a primary function: to permit the connection of an integrated circuit chip to an environment of use, such as a circuit board or an electronic device. These external connections cannot be made directly to a semiconductor die due to the thin and fragile nature of the electrical connections within a semiconductor die. Instead, a system of conductive package leads is provided to access the semiconductor die.

As shown in FIG. 1a, a lead system 10 is composed of many individual electrically conductive leads 12. When emplaced in a semiconductor package, each lead is generally continuous from the semiconductor die attach cavity to the printed circuit board or electronic product. The inner portion of a lead (which is proximal to the semiconductor die) is referred to as the inner lead, the bonding lead tip, or the inner bond finger 14. The mid-portion of the lead, which generally remains planar during packaging procedures, is referred to as the lead body 15. The outer portion of the lead (which is distal from the semiconductor die) is referred to as the outer lead 16, or, if appropriate, the package lead. FIG. 1b shows an end view of inner bond fingers 14 of the prior art, taken along line 1b—1b of FIG. 1a. FIG. 1c shows a cross-sectional view of a planar individual lead taken through line 1c—1c of FIG. 1a. In some packaging schemes, such as DIP, MQUAD, and the like, the outer lead 16 would be bent to form package leads (not shown). The outer lead 16 would thus be removed from the generally planar configuration of the lead body 15 and the inner bond finger 14. In other packaging schemes, such as chip-on-tape, leaded chip carrier package, and the like, the outer lead 16 would remain planar with the lead body 15 and the inner bond finger 14.

The lead system 10 may include a die attach pad (not shown). The lead system 10 can be made from a solid piece of conductive material, which is etched, stamped, or otherwise processed to form individual leads 12. In some applications, the lead system is formed on a non-conductive layer or uses a non-conductive tape structure, such as a polyimide layer (not shown), to maintain individual leads in position during processing.

Some prior art packaging systems maintain a substantially planar lead configuration throughout manufacturing, packaging, and use. Examples include leaded chip carrier packages, in which lead pins are electrically attached to the planar lead structure, and chip-on-tape packages. Other packaging schemes conform the outer leads 16 to yield package leads. Examples include DIP and MQUAD packages. However, in each of these prior art packaging schemes, the lead system which is housed within the package itself, i.e., the lead body 15 and the inner bond fingers 14, have been held in a uniform, generally planar, position throughout the manufacturing process.

FIG. 2 shows a cross-sectional view of a wirebond semiconductor package 20, in which the electrical connection between an individual bonding pad of the semiconductor die and an electrically conductive lead 12 is made using a thin connecting wire, the bond wire 22. The bond wire 22 is bonded at one end to a die bonding pad on the semiconductor die (for die input or output), and at the opposite end to an inner bond finger 14. In the pictured embodiment, each lead 12 include an inner bond finger 14, a lead body 15, and an outer lead 16, which has been processed to form a package lead.

The wirebond semiconductor package 20 generally includes a rigid protective housing 24 which surrounds the semiconductor die 18. The housing 24 is usually filled with a liquid potting mixture, or other encapsulant (not shown), which then hardens in situ. During the introduction of the liquid, however, the bond wires 22 are susceptible to midline motion or "sweep". As the fill liquid is introduced across the wires from a given direction, bond wires 22 which are parallel to the liquid flow are minimally disturbed. However, bond wires 22 which are perpendicular to (across) the flow of the liquid are easily bent out of position along the curve of the wires. Closely-spaced adjoining bond wires can be "swept" into a position in which they touch. As the liquid fill material solidifies, the touching bond wires can provide a permanent short-circuit of the semiconductor package, causing the semiconductor package to fail.

A variety of approaches have been put forward to minimize or eliminate the bond wire "sweep". The direction of the fill material entry ("top gating" and "bottom gating", for example) has been varied to minimize sweep.

"High/low bonding" has also been used to minimize sweep effects. This bonding pattern uses bonding wire loops of different lengths and heights to help maintain separation between the individual bonding wires. Both the "high" and the "low" bond wires in traditional high/low bonding patterns are fixed in a single plane at the semiconductor die and at another single plane at the lead system. While high/low bonding patterns provide increased separation between bonding wires during the bonding procedure itself, there are significant drawbacks to the system during the fill phases. The "high" bond wires have increased length, and thus are more flexible than the "low" bond wires. During a fill process, the "high" bond wires are easily flexed out of their original position and into a shorting relationship with adjacent wires. As noted above, when the bond wire length is in the same direction as the flow direction of the fill material, the problem is somewhat reduced. However, this problem is especially critical when high/low bond wires are located 90° from the source of the fill material.

The prior art bonding patterns and systems have not provided an adequate wire bonding pattern to minimize shorting during fill processes. Specifically, prior art wire bonds tend to short during fill procedures when closely positioned adjacent wires touch.

SUMMARY OF THE INVENTION

Prior art lead systems have generally defined a single plane through the lead bodies and the inner bond fingers. In contrast, lead systems of the subject invention include two discrete types of leads, which differ in structure at the inner bond finger. One type of lead is generally planar along the lead body and the inner bond finger. Because these inner bond fingers fall within the general plane defined by the pattern of lead bodies, they are referred to as "coplanar leads". The other type of lead is bent or deformed at the inner bond finger, such that the inner bond finger is not in the plane of the lead body, i.e., is not in the plane of the coplanar leads. For this reason, they are referred to as "aplanar leads".

Deforming select inner bond fingers out of the general plane of the lead system provides a spatial separation for the bonding wires which are attached to the inner bond fingers. This spatial separation acts to minimize wire contact and shorting during fill processes and results in improved semiconductor package yield.

BRIEF DESCRIPTION OF THE DRAWINGS

FIG. 1b shows an end view of the inner bond ends 14 of the leads 12 of FIG. 1a.

FIG. 1c shows a cross-sectional view of a typical lead 12 of the prior art, taken through line 1c—1c of FIG. 1a.

The Figures are drawn for clarity and are not drawn to scale. Similar numbers refer to similar structures throughout the Figures.

DISCLOSURE OF THE INVENTION INCLUDING BEST MODE

For ease of description, and not by way of limitation, the surface of the semiconductor die to which bond wires are attached, or which includes bond pads for bond wire attachment, will be referred to as the "top" of the semiconductor die. The "base" or "bottom" of the semiconductor die is that side opposite the top. Reference to "up" and "down" are consistent with this usage. The direction toward the center of the semiconductor die, or the semiconductor die position, is "in" or "inward". The direction toward the outside of the package, or toward the outer or package leads, is "out" or "outward". Such terminology is for convenience of reference only, and it will be understood that any desired spatial orientation is possible, and that directional references provide relative position rather than absolute positions.

Figure 1A:
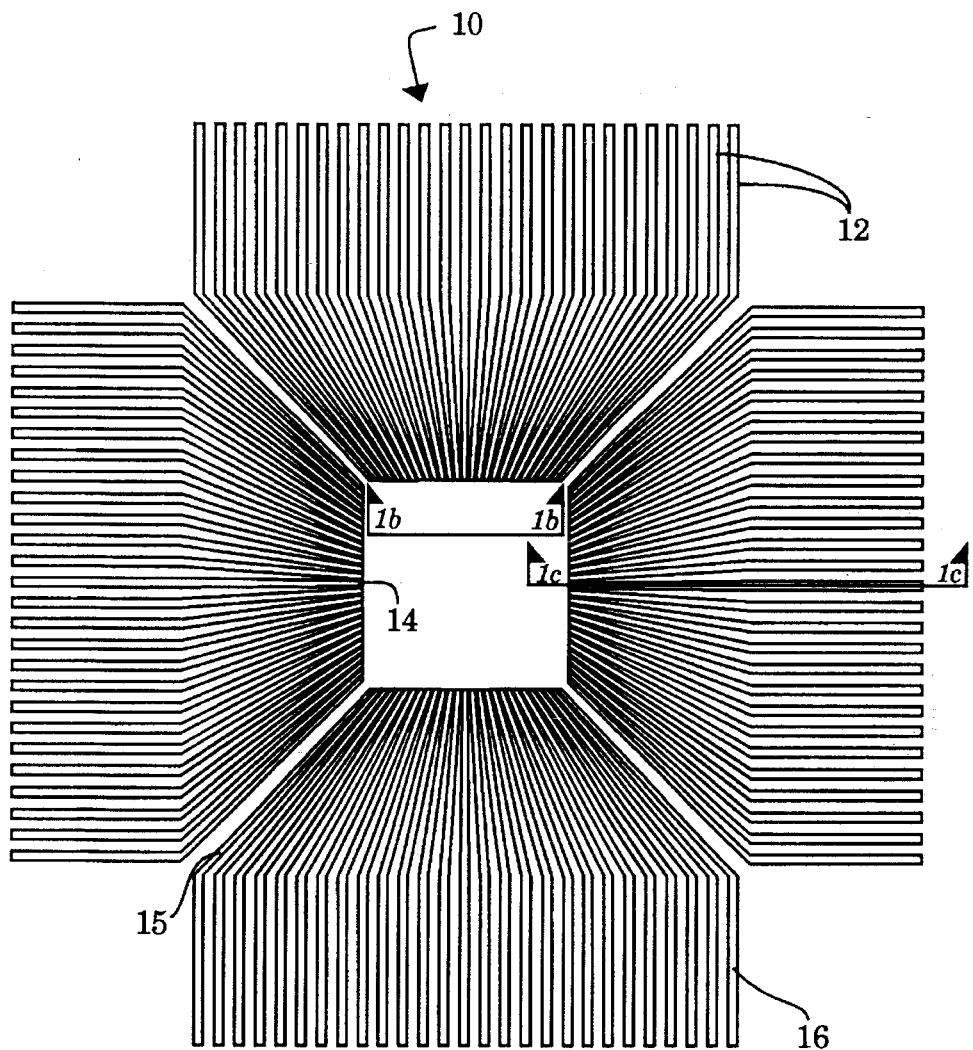
FIG. 1a shows a pattern of leads, such as those commonly wire bonded to a semiconductor die, in top view.
Figure 1B:
Figure 1C:
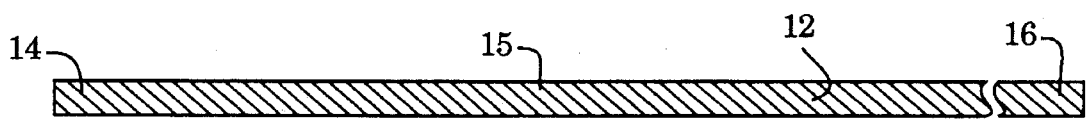
Figure 2:
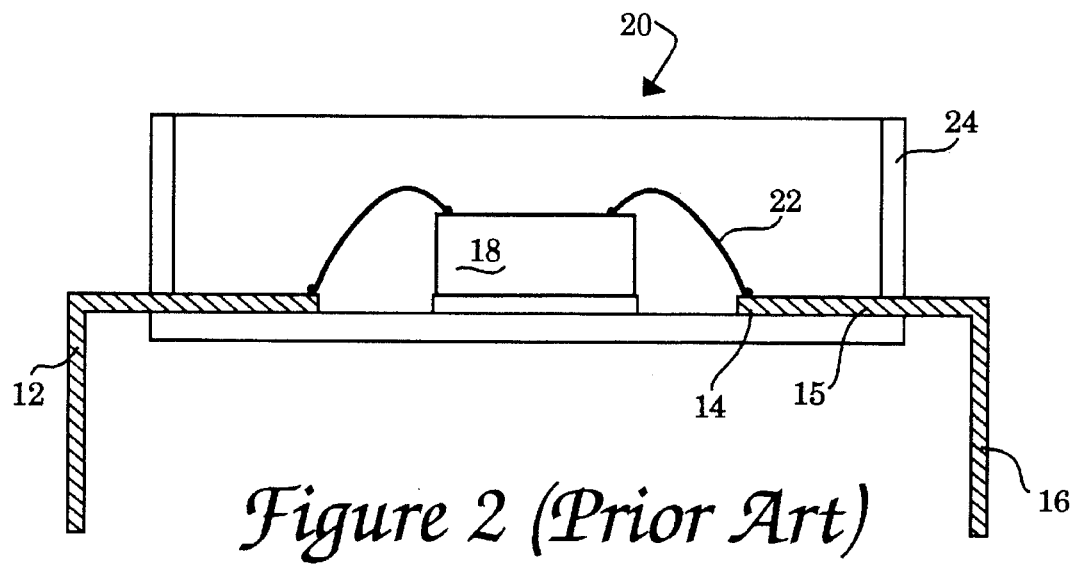
FIG. 2 shows a cross-sectional view of one type of wire bonded prior art semiconductor package.
Figure 3:
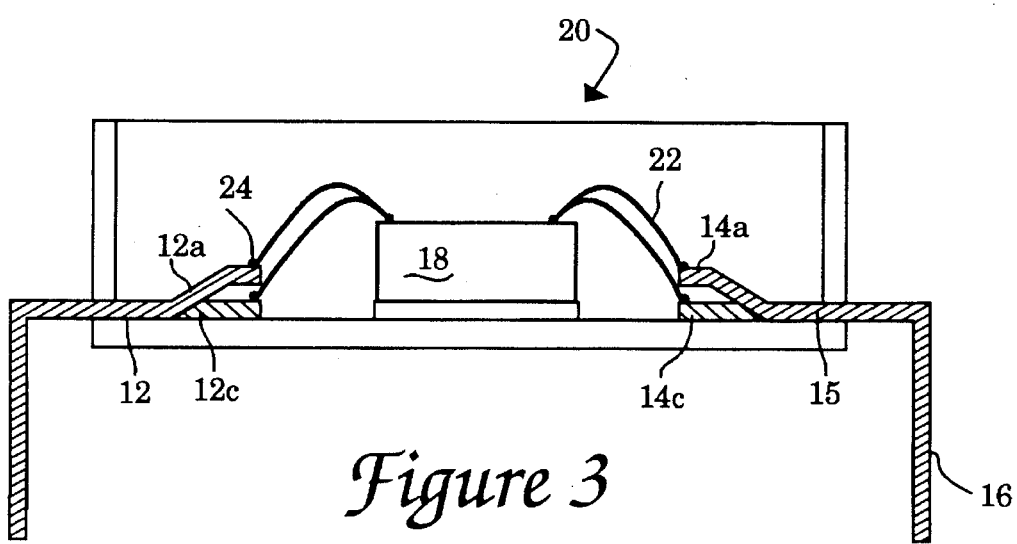
FIG. 3 shows a cross-sectional view of one type of wire bonded semiconductor package of the subject invention.

FIG. 3 shows a cross-sectional view of one embodiment of a wire bond semiconductor package of the subject invention. A semiconductor die 18 is bonded to a multiplicity of bond wires 22. Each bond wire 22 is, in turn, bonded either to a coplanar inner bond finger 14c or to an aplanar inner bond finger 14a which terminates a lead 12. The pattern of leads is generally planar through the lead bodies 15. The outer leads 16 are shaped to form package leads.

The lead system of the subject invention includes two different types of leads. The first type are coplanar leads 12c, i.e., leads which fall within the x–z plane defined by the lead bodies 15 surrounding the semiconductor die 18. Coplanar leads 12c include both lead bodies 15 and inner bond fingers 14c which are found within the x–z plane. The second type of leads are aplanar leads 12a. Aplanar leads 12a also include lead bodies 15 which lie within the x–z plane. However, aplanar leads 12a differ from coplanar leads 12c in that the inner bond finger 14a of an aplanar lead 12a extends significantly into the y plane, forming a three-dimensional structure. Aplanar leads 12a are three dimensional at or near the center of the lead system.

Deforming select aplanar inner bond fingers 14a out of the general plane of the lead system provides a spatial separation for the bonding wires 22 which are attached to the inner bond fingers, even when all bond wires 22 are the same or similar lengths. In turn, the spatial separation acts to minimize wire crossing and shorting during fill processes.

The bond wires which are appropriate for use are those well known in the art. Generally, the bond wires provide an electrical connection between an individual lead and a single bond pad on the upper surface of the semiconductor die. Bond wires can be of any appropriate conductive material. For example, aluminum wire can be used. Commonly, gold wire having a cross-sectional diameter of from about 0.5 mil or less, to about 1.3 mil or more, is used. Each bond wire is bonded at one end to a single lead, and at the opposite end to a single bond pad.

Figure 7:
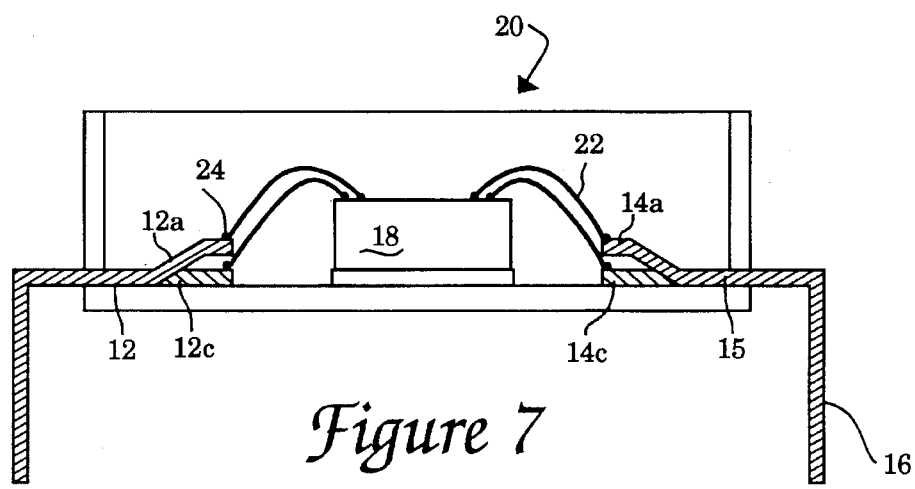
FIG. 7 shows a cross-sectional view of a wire bonded semiconductor package which includes staggered bond pads on the semiconductor die in conjunction with a lead system of the subject invention.

The bond pads on the semiconductor die may be arranged in a single row parallel to one or more edge of the semiconductor die. Alternatively, the bond pads may be placed in two or more rows, or may be staggered relative to one another, such as shown in FIG. 7. Individual bond pads may be placed eccentrically upon the surface of the semiconductor die. Bond pad placement is will known to the art, and virtually any bond pad placement can be adapted for use with the staggered aplanar lead system disclosed herein.

Bond wires may have a similar length throughout the semiconductor package, or they may have different lengths, as desired to provide an electrical connection between individual bond pads on the semiconductor die and individual inner bond fingers. "High/Low" bonding patterns may be combined with the staggered aplanar lead pattern herein to provide further bond wire separation.

The amount of deformation of the aplanar bond finger 14a in the y direction will depend in part upon the width of the bond wire used. In general, it is preferable that an aplanar bond finger 14a extends in the y direction to at least twice the diameter of the bond wire used. Thus, for a bond wire which is 1 mil in diameter, the upper surface of an aplanar lead 12a would extend at least 2 mil above the coplanar leads 12c. Similarly, for a bond wire which has a 0.6 mil diameter, the upper surface of an aplanar lead 12a would extend at least 1.2 mil above the coplanar leads 12c.

The upper limit of the extension of aplanar leads 12a in the y direction is a practical one. In general, the inner bond fingers 14a will not extend above the height of the semiconductor die used, and thus will be separated from the coplanar inner bond fingers 14c by less than about 12 to 19 mil.

Figure 4:
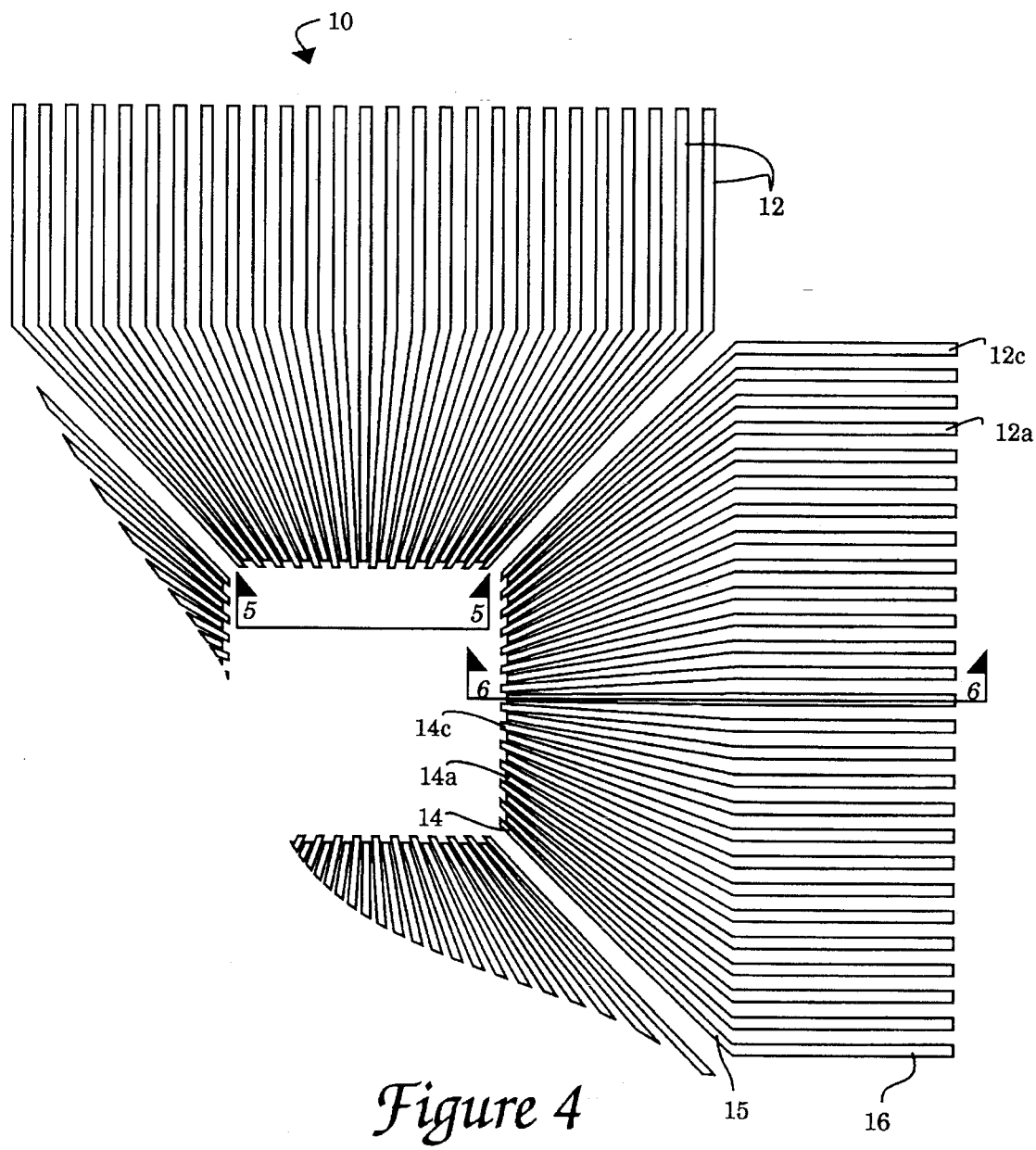
FIG. 4 shows a pattern of leads of the subject invention, in top view.

FIG. 4 shows a top view of a lead system 10 having a multiplicity of leads 12. Each lead 12 includes three regions: the innermost portion of a lead, which is proximal to the semiconductor die in a semiconductor package, is the inner bond finger 14. The outermost portion of the lead, which is distal from the semiconductor die in a semiconductor package, is referred to as the outer lead 16, or, if appropriate, the package lead. The lead body 15, lies between the inner bond finger 14 and the outer lead 16.

Leads may be generally linear from the outer lead 16 to the inner bond finger 14. Straight leads of a uniform width were very common in the early days of semiconductor manufacturing. More recently, however, leads are bent along their length, and vary in width from one end to the other. As shown in FIG. 4, for example, individual leads 12 are often wider at the outer lead 16 and narrower at the inner bond finger 14.

The specific preferred lead system will vary with the semiconductor chip and packaging system employed. Commonly, however, the width of an individual lead varies along the length of the lead. For example, an individual lead can be less than 0.003 inches wide at the inner bond finger end, and greater than 0.100 inches wide at the package end.

The center-to-center measurement between adjoining leads will vary with the width of the leads and the separation between the leads. The width of the leads is, to some degree, dependent upon the thickness of the leads and the process used to produce the leads. It may be desirable to stagger individual inner bond fingers in the x–z plane in order to provide sufficient separation for the efficient bonding of individual bond wires. Staggering inner bond fingers within the x–z plane is known to the art. However, unlike prior art lead systems, center-to-center lead separation of the subject invention can have each of an x, y, and z component.

The individual inner bond fingers may have any desired shape, and may conveniently be squared, rounded, oval, or eccentric, for example. Different inner bond fingers within a lead system may have different shapes.

While the specific width of individual leads will vary along their length, the thickness of a lead generally remains constant from the inner bond fingers to the outer lead. Lead thickness is usually in the range of from about 4 mil to about 10 mil.

The lead system 10 is usually made of a patterned conductive metal. A variety of appropriate metals are known to the art, and the metal used will depend upon the desired conductive attributes, and cost. Copper, gold, nickel, cobalt, zinc, lead, tin, titanium, and iron leads are especially appropriate, as are alloys, platings, or coatings made of conductive materials. When aplanar leads are made as part of a plated lead system, it is most convenient to form the inner bond finger into the desired shape prior to the plating process.

The aplanar leads are generally formed from coplanar leads which are bent or stamped into the desired three-dimensional configuration. Generally, a pattern of coplanar leads are produced as part of a leadframe. During the processing of the leadframe, the inner lead fingers are separated, and extraneous material is excised. Conveniently, the formation of the three-dimensional aplanar leads is accomplished with at the same time excess material is excised from the area. A cutting press is applied to the leadframe, which both removes excess material and bends the aplanar leads into the desired shape.

The aplanar leads are preferably configured prior to plating of the leads. Alternatively, coplanar and aplanar leads may be formed separately, and combined into a single lead pattern.

FIG. 4 shows coplanar leads 12c, and aplanar leads 12a. Both the coplanar and aplanar leads of FIG. 4 have similar length from the outer lead 16 to the inner bond finger 14. However, because the aplanar leads are bent into the y direction along the length of the inner bond finger 14, they appear to be shorter in top view.

In alternate embodiments, not shown, individual coplanar leads can be longer, shorter, or the same length as individual aplanar leads. In top view, each of the leads or lead types can appear to be coterminous, or can appear to be staggered (such as that shown in FIG. 4). Not all coplanar or aplanar leads must be the same length: individual coplanar leads or aplanar leads can be longer or shorter than any other leads, as desired, to assist in the semiconductor package design.

The lead system can be made from a solid piece of conductive material which is etched, stamped, or otherwise processed to form individual leads 16. A lead system can, but need not, include a die attach pad. In some applications, the lead system is formed on a non-conductive layer (not shown) or uses a non-conductive tape structure, such as a polyimide layer (not shown) to maintain individual leads in position during processing.

FIGS. 5a through 5e show some of the patterns which can be used to provide separation between bond wires (not shown) by the spatial separation of inner bond fingers.

Figure 5A:
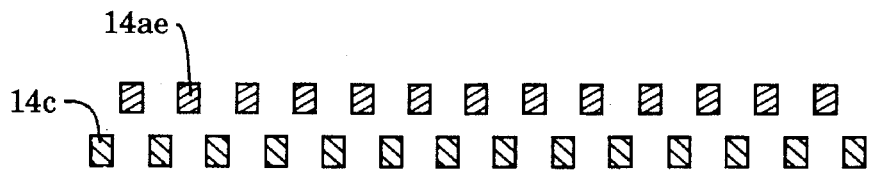
FIGS. 5a through d show alternate embodiments of the ends of the inner bond ends 14 of the leads 12 of FIG. 4, taken at line 5—5 of FIG. 4.

FIG. 5a shows a pattern in which the inner lead finger is raised, or elevated, above the general plane of the lead bodies. The aplanar elevated inner bond fingers 14ae alternate with coplanar bond fingers 14c. By elevating selected inner bond fingers 14ae from the general plane of the lead bodies and the coplanar inner bond fingers, a three-dimensional spatial separation of the bond wires (not shown) is achieved at the lead end. The center-to-center separation of adjoining inner bond fingers includes x, y, and z factors.

In general, it is convenient to position coplanar leads in a regular, alternating pattern with aplanar leads. As shown in FIG. 5a, coplanar inner bond fingers 14c can be alternated with aplanar elevated inner bond fingers 14ae. Cross-sectional views of aplanar leads 12a which are suitable for use in a pattern such as that of FIG. 5a can be found in FIGS. 6a and 6c. Similarly, leads of FIG. 6d could easily be provided in a pattern to yield the desired inner bond finger separation.

Figure 5B:

Similarly, as shown in FIG. 5b, coplanar inner bond fingers 14c can be alternated with aplanar lowered, or depressed, inner bond fingers 14ad. A cross-sectional view of one suitable aplanar lead 12a for use in a pattern such as that of FIG. 5b can be found in FIG. 6b. Similarly, leads of FIGS. 6b and 6d could easily be provided in a pattern to yield the shown inner bond finger separation.

Figure 5C:
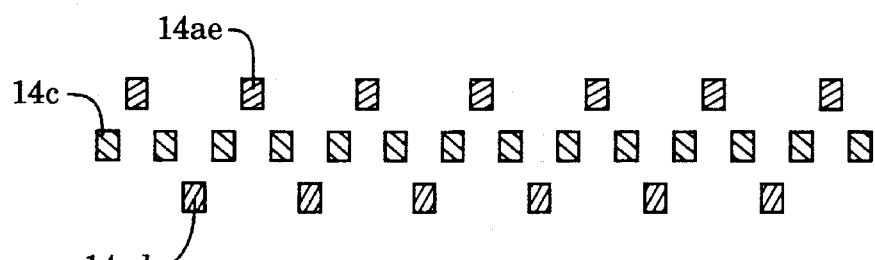

FIG. 5c shows the use of both elevated 14ae and depressed 14ad aplanar inner bond fingers in conjunction with the coplanar inner bond fingers 14c. The mixed use of elevated, coplanar, and depressed leads provides a stair-step pattern for increased inner bond finger separation, and thus bond wire separation. A cross-sectional view of an exemplary aplanar lead 12a for use in a pattern such as that of FIG. 5 is shown in FIG. 6e. Similarly, leads of FIGS. 6c and 6d could easily be adapted to yield the desired inner bond finger separation.

Figure 5D:
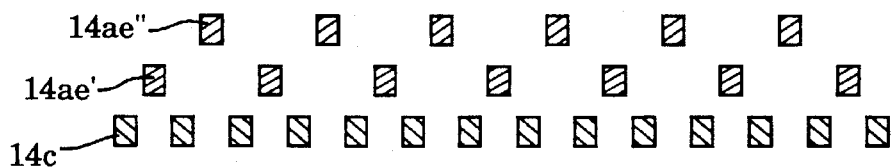

FIG. 5d shows a pattern in which coplanar inner bond fingers 14c are interspersed with aplanar elevated inner bond fingers having a first height 14ae', and with aplanar elevated inner bond fingers having a second height 14ae". One or more aplanar lead designs, such as those exemplified in cross-sectional view in FIGS. 6a through 6d, can be employed to provide the desired pattern and the desired inner bond finger separation.

Figure 6A:
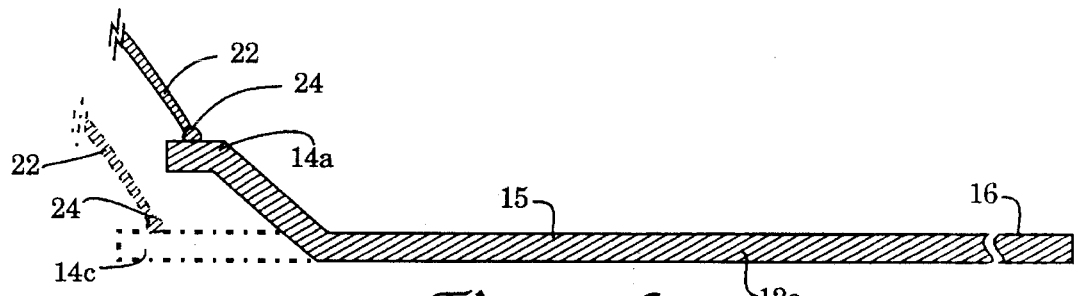
FIGS. 6a through e show alternate embodiments of an aplanar lead such as that taken at line 6—6 of FIG. 4.

FIG. 6a shows an aplanar lead 12a in a cross-sectional view such as that taken through line 6—6 of FIG. 4. The aplanar lead 12a is configured so that the bonding surface of the inner bond finger 14a is above the plane defined by the lead bodies 15. By providing a bonding surface apart from the general plane of the lead bodies 15, a separation of bond wires 22 is achieved.

In the embodiment shown in FIG. 6a, the aplanar lead 12a is the same or similar length as the coplanar lead 12c (shown in dashed outline) prior to the deformation that makes them aplanar. However, due to the three-dimensional configuration of the aplanar lead 12a, it does not extend as far toward the center of the pattern of leads as does the coplanar lead 12c. Thus, when viewed from the top, the inner bond fingers 14 of the pattern of aplanar leads 14a and coplanar leads 14c appear staggered, such as shown in FIG. 4. This is a convenient configuration, as all the leads can be patterned consistently prior to the bending of the aplanar leads 12a, and as the pattern provides a good staggering pattern in each of the x, y and z directions. Alternatively, the aplanar leads 12a can be longer or shorter than the coplanar leads prior to bending. The ends of the aplanar inner bond fingers 14a can be consistent with, or offset inward or outward, from the ends of the coplanar inner bond fingers 14c when the aplanar leads have been bent into three-dimensional configuration.

During the bonding process during which the bond wires are attached to the inner bond fingers, it is generally convenient to support each aplanar lead 12a or coplanar lead 12c in position. Stable positioning in the x–z plane can be provided by clamping the lead system in position, as is well known in the art. Stable positioning in the y direction is conveniently provided by providing an appropriate substrate that supports each lead in relative position during the bonding process.

The outer lead 16 of FIGS. 6a–e are shown as being generally planar with the lead bodies 15. This is common during many manufacturing steps. However, as noted above, the outer lead 16 may also be shaped to provide package leads, or otherwise molded or deformed from the planar position shown. As noted above, the shape or conformation of the outer lead 16 has no bearing on the designation of a particular lead as aplanar 12a or coplanar 12c, as this nomenclature refers only to the configuration of the inner bond finger 14 of a particular lead 12.

Figure 6B:
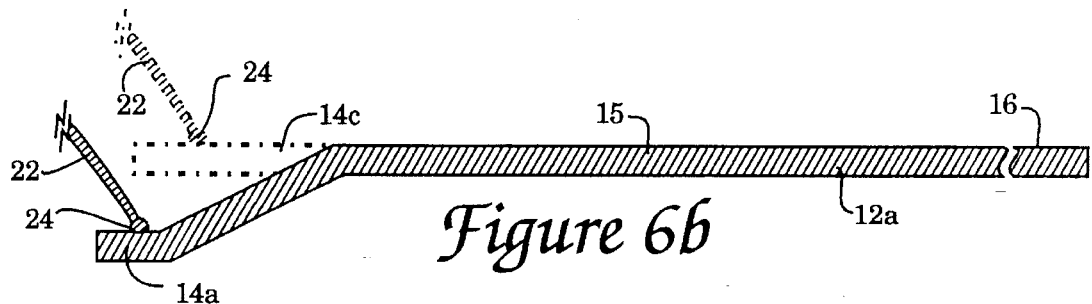

FIG. 6b shows an aplanar lead 12a in which the bonding surface is below the general plane of the lead bodies 15. The aplanar lead is extended in length so that the bond 24 is both beneath and inward compared to those of the coplanar leads. It thus also is a convenient configuration, as the pattern provides a good wire bond staggering pattern in each of the x, y and z directions.

Figure 6C:
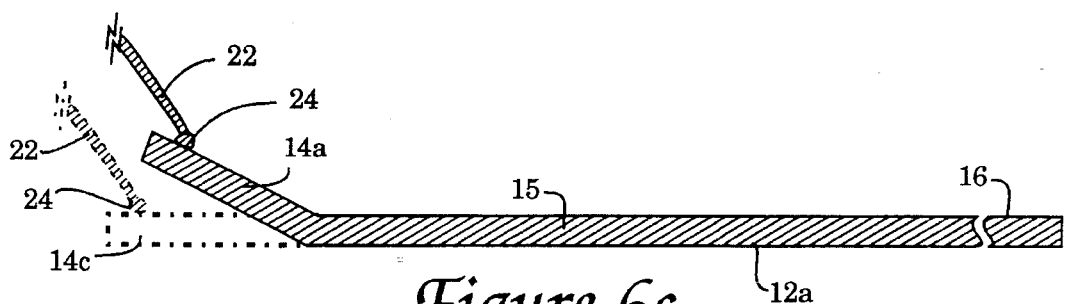

In the embodiments shown in FIGS. 6a and 6b, the bond 24 between the bond wire 22 and the inner bond finger 14a is formed on a plateau structure of the aplanar inner bond finger which is generally parallel to the general plane of the lead bodies 15. This may be desirable for convenience or preferred due to the bonder machinery used, but it is not necessary. FIG. 6c shows a configuration in which the aplanar lead 12a is deformed upwards at an angle from the general plane of the lead bodies, and the bond wire 22 is bonded at a surface which is not parallel to the general plane of the lead bodies 15.

Figure 6D:
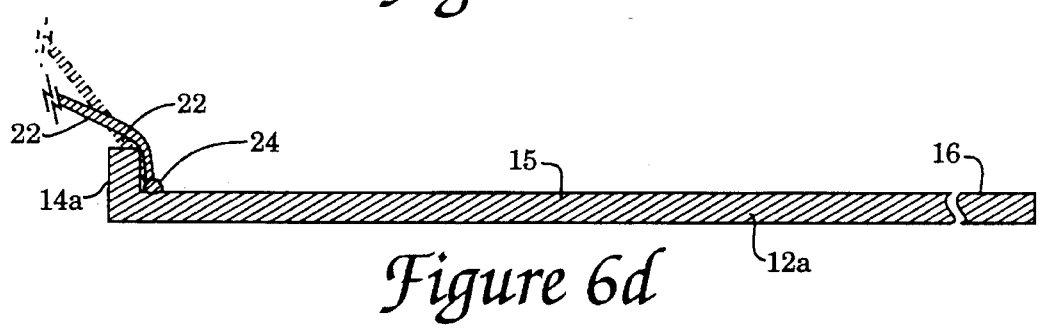
Figure 6E:
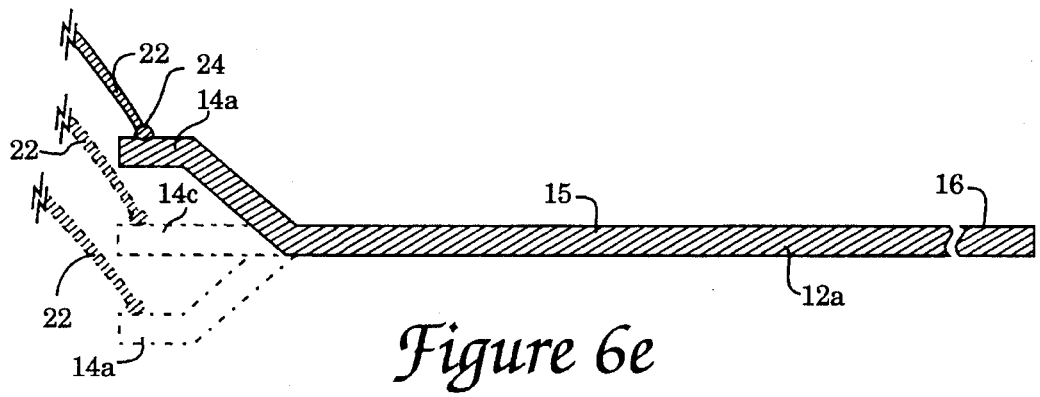

FIG. 6d shows an embodiment in which the aplanar lead 12a includes an inner bond finger 14a which is deformed specifically to cause deformation of the bond wire 22. This causes the bond wire 22 to bend out of the natural curve which is present in the bond wires bonded to planar leads (shown in dashed outline).

FIG. 6e shows an embodiment in which separate aplanar leads extend both above and beneath the coplanar leads, a configuration such as that shown in FIG. 5c. This provides increased separation for bond wires by providing three separate bond wire arcs.

FIG. 7 shows the benefits obtained when a lead system of this invention is used in conjunction with a staggered semiconductor bond pad pattern. The ends of bond wires 22 are separated in two dimensions at the surface of the semiconductor die 18, and in three dimensions at the leads 12. The use of the lead system of this invention thus provides improvements over each of the staggered bond pad, planar staggered lead finger, and high/low bonding patterns of the prior art.

Methods for use of the disclosed lead system are adapted from those known in the prior art. In general, however, the method herein for providing improved separation between bond wires includes providing bond wires between a semiconductor die each of at least one coplanar lead and at least one aplanar lead.

A bond wire is provided between a semiconductor die and a coplanar lead by bonding one end of a bond wire to a bond pad of a semiconductor die, and bonding the opposite end of the bond wire to a coplanar lead of a lead system containing both coplanar leads and aplanar leads. A bond wire is provided between a semiconductor die and an aplanar lead by bonding one end of a bond wire to a bond pad of a semiconductor die, and bonding the opposite end of the bond wire to an aplanar lead of a lead system containing both coplanar leads and aplanar leads.

As noted above, it is preferable that there be provided a regular pattern of both coplanar and aplanar leads, so that the bond wires are suitably separated. Aplanar leads may vary consistently in the y direction, or may have varying conformations. While the invention has been described in connection with several exemplary embodiments, it will be understood that many modifications will be apparent to those of ordinary skill in the art in light of the above disclosure. Such modifications may include using substitute materials, smaller or greater dimensions, more than one die in a package, greater or lesser numbers of bond pads, lead systems having greater or lesser pitch and number of leads, different types of integrated circuit devices, a variety of different packaging schemes, and so forth, to achieve substantially the same results in substantially the same way. Reference to the following claims should be made to determine the scope of the claimed invention.

We claim:

1. A lead system which includes both planar leads having planar inner bond fingers, and upper and lower aplanar leads; individual said upper aplanar leads being including inner bond fingers positioned above the inner bond fingers of said planar leads; and individual said lower aplanar leads having inner bond fingers positioned below the inner bond fingers of said planar leads.

2. A lead system of claim 1 wherein said lead system comprises planar leads alternating regularly with aplanar leads.

3. A semiconductor package containing an integrated circuit die, said package comprising:

(a) a pattern of electrically conductive leads which includes a plurality of planar leads, and a plurality of aplanar leads including inner bond fingers positioned above the plane of said planar leads;

(b) said integrated circuit die in bond wire connection with a plurality of said planar leads, and with a plurality of said aplanar leads; and (c) a housing enclosing the integrated circuit die and a portion of the pattern of electrically conductive leads.

4. A semiconductor package of claim 3 wherein said lead pattern comprises planar leads alternating regularly with aplanar leads.

5. A semiconductor package of claim 3 in which said aplanar leads are joined to a bond wire at an aplanar point.

6. A semiconductor package of claim 3 in which said aplanar leads are joined to a bond wire at a coplanar point.

7. A lead system which includes planar leads: first aplanar leads having a first height; and second aplanar leads having a second height; in which inner terminal ends of said first aplanar leads and said second aplanar leads are positioned above said planar leads.

8. A lead system which includes planar leads; first aplanar leads having a first height; and second aplanar leads having a second height; in which inner terminal ends of said first aplanar leads and said second aplanar leads are positioned below said planar leads.

* * * * *